United States Patent
Kaltner et al.

(10) Patent No.: US 9,124,274 B2
(45) Date of Patent: Sep. 1, 2015

(54) DEVICE AND METHOD FOR DETECTING A CLASPING OF A HAND-HELD DEVICE BY A HAND

(75) Inventors: Claus Kaltner, Bergkirchen (DE); Reinhard Unterreitmayer, Gauting (DE)

(73) Assignee: MICROCHIP TECHNOLOGY GERMANY GMBH II & CO. KG, Ismaning (DE)

( * ) Notice: Subject to any disclaimer, the term of this patent is extended or adjusted under 35 U.S.C. 154(b) by 527 days.

(21) Appl. No.: 13/513,076

(22) PCT Filed: Dec. 13, 2010

(86) PCT No.: PCT/EP2010/069514
§ 371 (c)(1),
(2), (4) Date: Nov. 19, 2012

(87) PCT Pub. No.: WO2011/070176
PCT Pub. Date: Jun. 16, 2011

(65) Prior Publication Data
US 2013/0057303 A1 Mar. 7, 2013

(30) Foreign Application Priority Data
Dec. 11, 2009 (DE) .................... 10 2009 057 935

(51) Int. Cl.
*G01R 27/26* (2006.01)
*H03K 17/96* (2006.01)
(Continued)

(52) U.S. Cl.
CPC .......... *H03K 17/962* (2013.01); *G01R 27/2605* (2013.01); *H03K 17/955* (2013.01); *H03K 17/96* (2013.01); *G01D 5/24* (2013.01); *G01D 5/2417* (2013.01)

(58) Field of Classification Search
CPC ... H03K 17/962; H03K 17/96; H03K 17/955; G01D 5/24; G01D 5/2417; G01L 9/12; G06K 9/0002; G01B 7/023; G01R 27/2605

USPC ......... 324/683, 658, 649, 600, 684, 686, 687, 324/688, 144
See application file for complete search history.

(56) References Cited

U.S. PATENT DOCUMENTS

| 7,433,718 | B2 | 10/2008 | Manabe et al. ............. 455/575.1 |
| 2011/0025345 | A1* | 2/2011 | Unterreitmayer ............. 324/600 |

(Continued)

FOREIGN PATENT DOCUMENTS

| CN | 1471334 A | 1/2004 | ........... A61B 5/0478 |
| CN | 2904105 Y | 5/2007 | .............. G06F 3/038 |

(Continued)

OTHER PUBLICATIONS

Japanese Office Action, Application No. 2012-542576, 9 pages, Aug. 14, 2014.
(Continued)

*Primary Examiner* — Hoai-An D Nguyen
(74) *Attorney, Agent, or Firm* — Slayden Grubert Beard PLLC

(57) ABSTRACT

A device for an electric hand-held device for detecting the hand-held device being clasped by a hand, has at least one transmitting electrode, which can emit an alternating electric field, and at least one receiving electrode, in which the alternating electric field can be coupled at least partially, wherein the at least one transmitting electrode and the at least one receiving electrode can be arranged on the hand-held device such that each of them is at least partially covered by the hand when the hand-held device is being clasped by the hand. When the hand-held device is being clasped by the hand, a first portion of the alternating electric field emitted by the transmitting electrode can be coupled via the hand into the receiving electrode, wherein at least the first portion of the alternating electric field is a characteristic representative of the hand-held device being clasped by the hand.

19 Claims, 10 Drawing Sheets

(51) Int. Cl.
*H03K 17/955* (2006.01)
*G01D 5/241* (2006.01)
*G01D 5/24* (2006.01)

(56) References Cited

U.S. PATENT DOCUMENTS

| | | | |
|---|---|---|---|
| 2012/0026121 A1* | 2/2012 | Unterreitmayer et al. | 345/174 |
| 2013/0057303 A1 | 3/2013 | Kaltner et al. | 324/683 |
| 2013/0176693 A1* | 7/2013 | Gute | 361/749 |
| 2014/0139240 A1* | 5/2014 | Burger | 324/658 |

FOREIGN PATENT DOCUMENTS

| | | | | |
|---|---|---|---|---|
| DE | 102008020819 A1 | 10/2009 | | G06F 3/033 |
| JP | 2004-163128 A | 6/2004 | | G01D 5/24 |
| JP | 200573086 A | 3/2005 | | H04B 1/44 |
| JP | 2006220542 A | 8/2006 | | G01F 23/26 |
| WO | 2009/130165 A2 | 10/2009 | | G06F 3/033 |
| WO | 2011/070176 A2 | 6/2011 | | H03K 17/96 |

OTHER PUBLICATIONS

International Search Report, Application No. PCT/EP2010/069514, 2 pages, Mar. 5, 2013.
International Preliminary Report on Patentability, Application No. PCT/EP2010/069514, 10 pages, Mar. 12, 2013.
Japanese Office Action, Application No. 2012-542579, 8 pages, Mar. 18, 2015.

* cited by examiner

DEVICE AND METHOD FOR DETECTING A CLASPING OF A HAND-HELD DEVICE BY A HAND

CROSS-REFERENCE TO RELATED APPLICATIONS

This application is a U.S. National Stage Application of International Application No. PCT/EP2010/069514 filed Dec. 13, 2010, which designates the United States of America, and claims priority to German Application No. 10 2009 057 935.4 filed Dec. 11, 2009, the contents of which are hereby incorporated by reference in their entirety.

TECHNICAL FIELD

The present disclosure relates to a device for an electric hand-held device for detecting the hand-held device being clasped by a hand, so that during a clasping of the hand-held device by the hand the hand-held device for example may be transferred from a sleep mode to an active mode. Furthermore, the present disclosure relates to an electric hand-held device comprising a detection device according to various embodiments as well as a method for detecting a clasping of an electric hand-held device by a hand.

BACKGROUND

In conventional electric devices and, in particular, electric hand-held devices an improved energy efficiency is desired. In particular with portable hand-held devices, as for example remote controls or cell phones, which provide batteries or accumulators for the energy supply, such a requirement exists in an intensified manner, since batteries or accumulators exhaust quickly. Increased energy efficiency would lower the current consumption, which results in a higher durability of the batteries or accumulators. In addition, improved energy efficiency would bring along an advantageous ecological effect since fewer batteries or accumulators, respectively, have to be introduced to waste disposal.

Conventional electric hand-held devices can be transferred or switched to a so called sleep mode when not in use. In the sleep mode all functions of the hand-held device are deactivated, which only are required during an operating phase of the hand-held device. In doing so, the power consumption of the electric hand-held device may be reduced considerably. During usage of the hand-held device it is transferred into an active mode, in which the complete functionality or operability of the device is available.

In order to transfer a hand-held device into the sleep mode on the one hand and to transfer it from the sleep mode into the active mode on the other hand it is known to provide switches and buttons at the hand-held device, with the help of which the respective mode may be activated manually. This has the disadvantage that hand-held devices, also when not in use, as for example in a computer mouse, often stay in an active mode since a manual activation or deactivation of the active mode appears to be relatively inconvenient or simply is forgotten. As a result, the desired improvement of the energy efficiency to a large extent is not reached.

SUMMARY

Therefore, according to various embodiments solutions can be provided, by means of which the energy efficiency of electric hand-held devices may be improved reliably and at the same time the operating comfort of the electric hand-held devices may be improved.

According to an embodiment, a device for an electric hand-held device for detecting a clasping of the hand-held device by a hand, may comprise at least one transmitting electrode, from which an alternating electric field can be emitted, and at least one receiving electrode, into which the alternating electric field can be coupled at least partially, wherein the at least one transmitting electrode and the at least one receiving electrode can be arranged at the hand-held device such that each is at least partially covered by the hand when the hand-held device is being grasped with the hand, wherein when the hand-held device is being grasped with the hand a first portion of the alternating electric field emitted by the transmitting electrode can be coupled into the receiving electrode via the hand, and wherein the first portion of the alternating electric field is a characteristic representative of a clasping of the hand-held device by the hand.

According to a further embodiment of the device, the device may further comprise at least one electrically conductive structure that can be coupled with the ground potential of the electric hand-held device, wherein the electrically conductive structure is arranged relative to the transmitting electrode and to the receiving electrode in a way to, when the hand-held device is not clasped, substantially prevent a coupling of the alternating electric field emitted from the transmitting electrode into the receiving electrode. According to a further embodiment of the device, a second portion of the alternating electric field can be coupled into the electrically conductive structure, and a third portion of the alternating electric field, which is smaller in absolute value than the second portion, can be coupled into the receiving electrode. According to a further embodiment of the device, during clasping of the hand-held device the third portion of the alternating electric field is smaller in absolute value than the first portion of the alternating electric field. According to a further embodiment of the device, the first portion of the alternating electric field generates a first electric current in the receiving electrode, the third portion of the alternating electric field generates a second electric current in the receiving electrode, and the third portion of the alternating electric field is incorporated into the representative characteristic additionally, wherein the representative characteristic is constituted by an overall current, which results from the first electric current and the second electric current. According to a further embodiment of the device, the overall current above a predetermined threshold value is indicative for a clasping of the hand-held device. According to a further embodiment of the device, the overall current, which in absolute value is greater than a predetermined threshold value, is indicative for a clasping of the hand-held device. According to a further embodiment of the device, the transmitting electrode can be arranged on a first side wall of a housing of the hand-held device, and the receiving electrode can be arranged on a second side wall of the housing of the hand-held device, wherein the first side wall is arranged opposite to the second side wall. According to a further embodiment of the device, the receiving electrode can be coupled with a capacitive sensor, which comprises a signal generator, the output signal of the capacitive sensor depends on the capacitive load of the sensor at the receiving electrode, and the transmitting electrode is coupled with the signal generator via a phase shifter to load the transmitting electrode with a signal, which is shifted in its phase with respect to the signal of the signal generator. According to a further embodiment of the device, between the receiving electrode and the housing and/or between the transmitting electrode and the housing each an electrically conductive layer coupled with the ground potential of the electric hand-held device can be arranged, wherein the surface area of the electrically conductive layer in each case is larger than the surface area of the receiving electrode and/or of the transmitting electrode. According to a further embodiment of the device, the device may comprise at least two transmitting electrodes, wherein the first transmitting electrode can be loaded with a first alternating electric signal and the second transmitting electrode can be loaded with a second alternating electric signal, wherein the frequency of the first alternating electric signal is different to the frequency of the second alternating electric signal. According to a further embodiment of the device, an interpretation device is formed to separate the frequency components of the alternating electric field coupled into the receiving electrode and to allocate them to the respective transmitting electrode.

According to another embodiment, in a method for detecting a clasping of an electric hand-held device by a hand by means of a detection device, which has at least one transmitting electrode and at least one receiving electrode, wherein the at least one transmitting electrode is loaded with an alternating electric voltage so that an alternating electric field is emitted at the at least one transmitting electrode, during clasping of the hand-held device with a hand a first portion of the alternating electric field is coupled into the receiving electrode via the hand, and the first portion of the alternating electric field produces a first electric current in the receiving electrode, which is indicative for a clasping of the hand-held device.

According to a further embodiment of the method, the detection device has at least one electrically conductive structure that can be coupled with the ground potential of the electric hand-held device and wherein the electrically conductive structure is arranged relative to the transmitting electrode and to the receiving electrode such that during non-clasping of the hand-held device a coupling of the alternating electric field emitted at the transmitting electrode into the receiving electrode substantially is prevented. According to a further embodiment of the method, during non-clasping of the hand-held device a second portion of the alternating electric field is coupled into the electrically conductive structure and a third portion of the alternating electric field, which in absolute value is smaller than the second portion, is coupled into the receiving electrode, during clasping of the hand-held device the third portion of the alternating electric field in absolute value is smaller than the first portion of the alternating electric field, and the third portion of the alternating electric field produces a second electric current in the receiving electrode, wherein the overall current, which results from the first electric current and the second electric current, is indicative for a clasping of the hand-held device. According to a further embodiment of the method, a switching-on mode and/or an active mode of the hand-held device is caused when the overall current exceeds a predetermined threshold value; and/or a sleep mode of the hand-held device is caused when the overall current falls below a predetermined threshold value.

According to yet another embodiment electric hand-held device may comprise at least one device as described above for detecting a clasping of the hand-held device by a hand.

According to a further embodiment of the electric hand-held device, the at least one transmitting electrode and the at least one receiving electrode are arranged at the hand-held device such that they each are at least partially covered by the hand when the hand-held device is being grasped with the hand. According to a further embodiment of the electric hand-held device, the electric hand-held device comprises at least one of a cell phone, an input means for gaming console, a mobile minicomputer, a headphone, a hearing aid device, a computer mouse, and a remote control.

BRIEF DESCRIPTION OF THE DRAWINGS

Further details and characteristics of various embodiments result from the following description in connection with the drawings.

DETAILED DESCRIPTION

Figure 1:
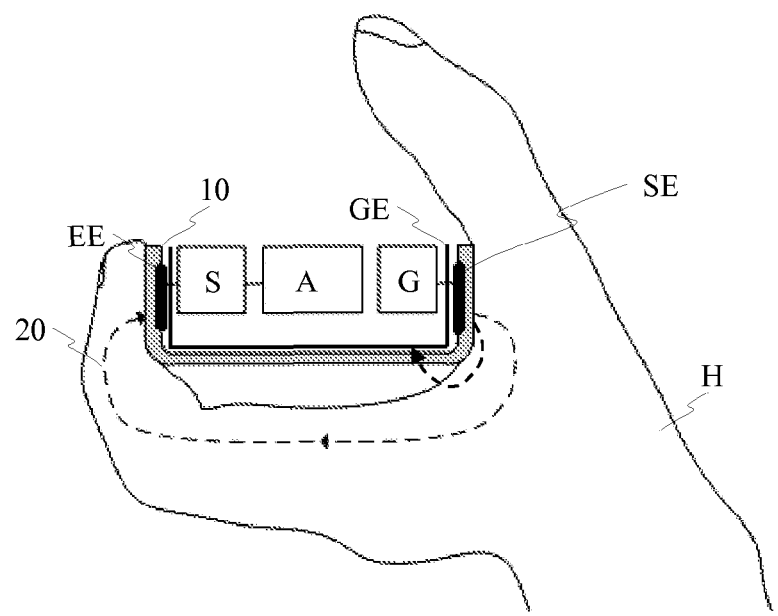
FIG. 1 shows an electric hand-held device, which is clasped by a hand, as a description of the principle of function of the detection device according to various embodiments.

As mentioned above, a device for an electric hand-held device for detecting a clasping of the hand-held device by a hand is provided, may comprise at least one transmitting electrode, from which an alternating electric field can be emitted, and at least one receiving electrode, into which the alternating electric field can be coupled at least partially, wherein the at least one transmitting electrode and the at least one receiving electrode can be arranged at the hand-held device such that they each at least partially are covered by the hand when the hand-held device is being grasped with the hand, wherein when the hand-held device is being grasped with the hand a first portion of the alternating electric field emitted from the transmitting electrode can be coupled into the receiving electrode via the hand, and wherein the first portion of the alternating electric field is a representative characteristic for a clasping of the hand-held device by the hand.

It is a substantial advantage that the device according to various embodiments itself only requires very little energy to detect reliably a clasping of the hand-held device by a hand. In addition, the operation and the usage, respectively, of the hand-held device is simplified significantly because an actuation of a button is not required anymore in order to transfer the hand-held device from a sleep mode into an operating or active mode on the one hand and to transfer the hand-held device from an operating or active mode into a sleep mode on the other hand. In doing so, it has proven to be especially advantageous that the switches provided for switching the operation modes according to prior art may be omitted, which brings along additional creative freedom for the design of the hand-held device.

The device further may have at least one electrically conductive structure that can be coupled with the ground potential of the electric hand-held device, wherein the electrically conductive structure is arranged relative to the transmitting electrode and to the receiving electrode such that during a non-clasping of the hand-held device a coupling of the alternating electric field emitted from the transmitting electrode into the receiving electrode substantially is prevented.

Furthermore, the device may have at least one electrically conductive structure that can be coupled with the ground potential of the electric hand-held device, wherein the electrically conductive structure can be arranged relative to the transmitting electrode and to the receiving electrode such that a second portion of the alternating electric field can be coupled into the electrically conductive structure, and a third portion of the alternating electric field, which in absolute value is smaller than the second portion, can be coupled into the receiving electrode, in order to, during non-clasping of the hand-held device, substantially prevent a coupling of the alternating electric field emitted from the transmitting electrode into the receiving electrode, wherein during clasping of the hand-held device the third portion of the alternating electric field in absolute value is smaller than the first portion of the alternating electric field.

In doing so, it can be discriminated very precisely whether the alternating electric field coupled into the receiving electrode is caused by a clasping of the hand-held device with a hand, i.e. is coupled into the receiving electrode via the hand, or by an electrically conductive shelf space, for example, onto which the hand-held device has been deposited. Erroneous interpretations and malfunctions, respectively, can be avoided efficiently this way, because the alternating electric field coupled into the receiving electrode is very much smaller in the deposited state than in the grasped state.

The first portion of the alternating electric field may produce a first electric current in the receiving electrode and the third portion of the alternating electric field may produce a second electric current in the receiving electrode, wherein in addition the third portion of the alternating electric field is integrated into the representative characteristic, while the representative characteristic is formed by the overall current resulting from the first electric current and the second electric current.

An overall current above a predetermined threshold may be indicative for a clasping of the hand-held device. This threshold may be adjusted depending on the device.

Further, the overall current, which in absolute value is larger than a predetermined threshold value, may be indicative for a clasping of the hand-held device.

The hand-held device may comprise a housing, wherein the transmitting electrode and the receiving electrode may be arranged on the surface or close below the surface of the housing.

The transmitting electrode may be arranged at a first side wall of a housing of the hand-held device and the receiving electrode may be arranged at a second side wall of the housing of the hand-held device. The first side wall may be arranged opposite to the second side wall. In doing so, it is ensured in a particularly simple manner that during a clasping of the hand-held device by a hand the transmitting electrode and the receiving electrode are covered by the hand at least partially and that in the deposited state of the hand-held device a coupling of the alternating electric field into the receiving electrode via the shelf space is prevented for the most part.

It has been approved to be particularly advantageous to choose the surface areas of the transmitting electrode and of the receiving electrode such that they substantially correspond to the contact surface of the hand at the housing.

The receiving electrode may be coupled with a capacitive sensor, which comprises a signal generator, wherein the output signal of the capacitive sensor is dependent on the capacitive load of the sensor at the receiving electrode, wherein the transmitting electrode is coupled with the signal generator via a phase shifter to load the transmitting electrode with a signal shifted in phase relative to the signal of the signal generator.

The receiving electrode and the transmitting electrode each may be arranged at the hand-held device electrically insulated from the hand-held device. In doing so, also electric hand-held devices comprising a metallic housing may be provided with the device according to various embodiments, wherein a coupling of the alternating electric field via the metallic housing into the receiving electrode mostly is avoided or prevented by the insulation.

Between the receiving electrode and the housing and/or between the transmitting electrode and the housing an electrically conductive layer coupled with the ground potential of the electric hand-held device may be arranged, wherein the surface area of the electrically conductive layer in each case is larger than the surface area of the receiving electrode and/or the transmitting electrode. A coupling of the alternating electric field into the receiving electrode via a metallic housing thus may be reduced further.

Also provided by further embodiments is a method for detecting a clasping of an electric hand-held device by a hand comprising a detection device, which has at least one transmitting electrode and at least one receiving electrode, wherein the at least one transmitting electrode is loaded with an alternating electric voltage, so that an alternating electric field is emitted at the at least one transmitting electrode, wherein
- during clasping of the hand-held device with a hand a first portion of the alternating electric field is coupled into the receiving electrode via the hand, and
- the first portion of the alternating electric field produces a first electric current in the receiving electrode, which is indicative for a clasping of the hand-held device.

The detection device may at least have one electrically conductive structure that can be coupled with the ground potential of the electric hand-held device, wherein
- during non-clasping of the hand-held device a second portion of the alternating electric field is coupled into the electrically conductive structure and a third portion of the alternating electric field, which in absolute value is smaller than the second portion, is coupled into the receiving electrode,
- during clasping of the hand-held device the third portion of the alternating electric field in absolute value is smaller than the first portion of the alternating electric field, and
- the third portion of the alternating electric field produces a second electric current in the receiving electrode, wherein the overall current resulting from the first electric current and the second electric current is indicative for a clasping of the hand-held device.

It is advantageous when
- a switching-on mode and/or an active mode of the hand-held device is caused when the overall current exceeds a predetermined first threshold value; and/or
- a sleep mode of the hand-held device is caused when the overall current falls below a predetermined second threshold value.

The first threshold value and the second threshold value may be identical. However, they also may be different.

The receiving electrode may be coupled with a capacitive sensor, which comprises a signal generator and whose output signal is dependent on the capacitive load at the receiving electrode, wherein the transmitting electrode is loaded by the signal generator with an alternating signal, which is shifted in phase relative to the signal of the signal generator.

Also provided by further embodiments is an electric hand-held device, which comprises a detection device according to the device embodiments for detecting a clasping of the hand-held device.

The at least one transmitting electrode and the at least one receiving electrode may be arranged at the hand-held device such that each of them is covered at least partially by the hand when the hand-held device is being grasped.

The electric hand-held device may at least comprise one of a cell phone, an input means for a gaming console, a mobile minicomputer, a headphone, a hearing aid device, a computer mouse and a remote control.

Furthermore, provided by various other embodiments is a method for manufacturing a hand-held device comprising a device according to various device embodiments for detecting a clasping of the hand-held device by a hand, wherein
- arranged at the hand-held device are at least one transmitting electrode, from which an alternating electric field can be emitted, at least one receiving electrode, into which the alternating electric field can be coupled at least partially, and at least one electrically conductive structure,
- the at least one transmitting electrode and the at least one receiving electrode are arranged such that when the hand-held device is being grasped with the hand a first portion of the alternating electric field emitted by the transmitting electrode can be coupled into the hand and by the hand into the receiving electrode, and
- the electrically conductive structure is arranged relative to the transmitting electrode and to the receiving electrode such that a second portion of the alternating electric field can be coupled into the electrically conductive structure and a third portion of the alternating electric field, which in absolute value is smaller than the second portion, can be coupled into the receiving electrode to substantially prevent a coupling of the alternating electric field emitted by the transmitting electrode into the receiving electrode during non-clasping of the hand-held device, wherein during clasping of the hand-held device the third portion of the alternating electric field in absolute value is smaller than the first portion of the alternating electric field.

Also provided is a method for detecting a clasping of an electric hand-held device by a hand comprising a detection device, which has at least one transmitting electrode and at least one receiving electrode, wherein the at least one transmitting electrode is loaded with an alternating electric signal, preferably an alternating electric voltage, so that at the at least one transmitting electrode an alternating electric field is emitted, wherein
- during clasping of the hand-held device with a hand a first portion of the alternating electric field is coupled into the receiving electrode via the hand, and
- the first portion of the alternating electric field produces a first electric current in the receiving electrode, which is indicative for a clasping of the hand-held device.

Preferably, the detection device has at least one electrically conductive structure that can be coupled with the ground potential of the electric hand-held device, wherein the electrically conductive structure is arranged relative to the transmitting electrode and to the receiving electrode such that during non-clasping of the hand-held device a coupling of the alternating electric field emitted at the transmitting electrode into the receiving electrode substantially is prevented.

Preferably, the method is designed such that
- during non-clasping of the hand-held device a second portion of the alternating electric field is coupled into the electrically conductive structure and a third portion of the alternating electric field, which in absolute value is smaller than the second portion, is coupled into the receiving electrode,
- during clasping of the hand-held device the third portion of the alternating electric field in absolute value is smaller than the first portion of the alternating electric field, and the third portion of the alternating electric field produces a second electric current in the receiving electrode, wherein the overall current, which results from the first electric current and the second electric current, is indicative for a clasping of the hand-held device.

Furthermore, the method may be adapted such that a switching-on mode and/or an active mode of the hand-held device is caused, when the overall current exceeds a predetermined threshold value; and/or a sleep mode of the hand-held device is caused, when the overall current falls below a predetermined threshold value.

FIG. 1 shows an electric hand-held device in cross-sectional view comprising a detection device according to various embodiments, wherein the hand-held device is clasped by a hand H. Arranged at a side wall of the electric hand-held device is a transmitting electrode SE and at a side wall arranged opposite to this side wall a receiving electrode EE is arranged. The transmitting electrode SE and the receiving electrode EE in this case are arranged at the side walls of the hand-held device opposing each other such that during a clasping of the housing with a hand both electrodes are covered by the hand at least partially.

The transmitting electrode SE is coupled with a signal generator G, which produces a low-frequency alternating electric voltage. The transmitting electrode SE is loaded with this alternating electric voltage. In doing so, an alternating electric field 20 is formed at the transmitting electrode SE. The alternating electric voltage provided by the generator G approximately has a frequency of between 10 kHz and 300 kHz. Preferably, the alternating electric voltage has a frequency between 75 kHz and 150 kHz.

As can be seen from FIG. 1 the clasping of the hand-held device by a hand H leads to a capacitive coupling between the transmitting electrode SE and the receiving electrode EE. The capacitive coupling between the transmitting electrode SE and the receiving electrode EE is greater during clasping of the hand-held device by a hand than a capacitive coupling without a clasping by a hand or in a deposited state of the hand-held device. A complete clasping of the hand-held device by the hand, i.e. that the hand completely encloses the hand-held device, is not required. It is sufficient when the hand abuts to both side walls, i.e. in the region of the transmitting electrode and of the receiving electrode, respectively, so that the hand at least partially covers the transmitting electrode and the receiving electrode.

The alternating electric field emitted by the transmitting electrode SE is received by the hand H and is transferred to the receiving electrode and coupled into it. The capacitive sensor S, which is coupled with the receiving electrode, receives the signal and feeds it to an interpretation device A.

The surface areas of the sensor electrode and the receiving electrode preferably are chosen such that they correspond to the abutment area of the hand and the fingers, respectively, at the housing 10 in the clasped state. Overall, the detection device at the electric hand-held device is designed such that without clasping by a hand H the capacitive coupling between the sensor electrode SE and the receiving electrode EE is minimized or prevented, respectively. In addition, the system is designed such that a capacitive coupling between the sensor electrode SE and the receiving electrode EE in the inside of the housing also is reduced or prevented, respectively, as described in more detail referring to the following figures.

Figure 4:
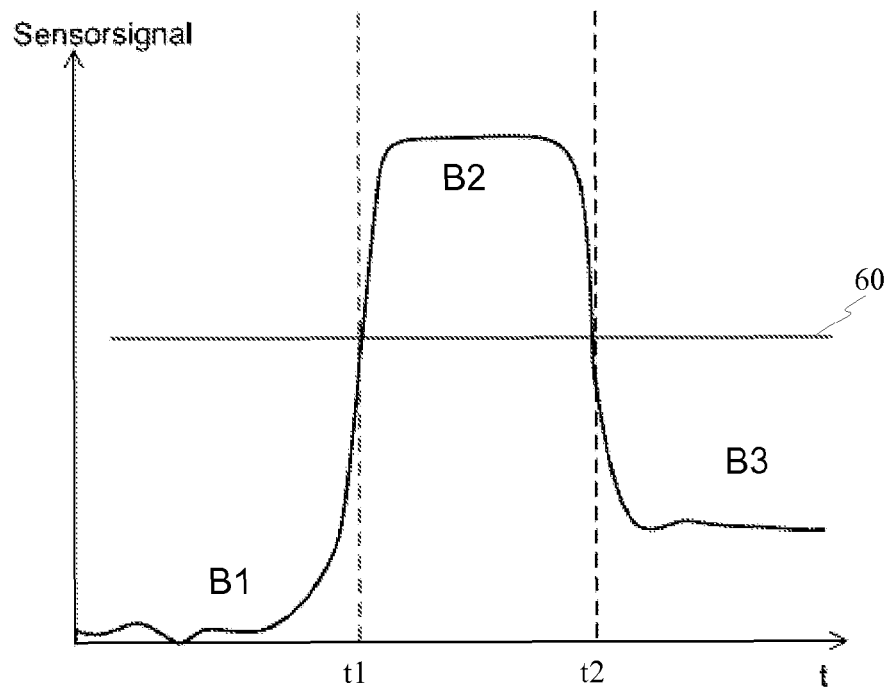
FIG. 4 shows the temporal behavior of a sensor signal in dependence on whether the hand-held device is deposited on a non-conductive or on a conductive shelf space and whether the hand-held device is clasped by a hand, respectively.

Because the clasping of the electric hand-held device by a hand H results in a strong capacitive coupling between the transmitting electrode SE and the receiving electrode EE and because the capacitive coupling between these two electrodes in a deposited state or during non-clasping by a hand H, respectively, is very small or is absent, respectively, a particularly reliable detection of a clasping is feasible, since the clasping by a hand results in a strong increase of the capacitive coupling, which again results in a strong increase of the electric current produced at the receiving electrode EE, as will be described in more detail with reference to FIG. 4.

When the electric hand-held device is deposited, therefore not is clasped by a hand H, then the strong capacitive coupling between the transmitting electrode SE and the receiving electrode EE is missing, i.e. coupled into the receiving electrode EE only is a very small portion of the alternating electric field emitted at the transmitting electrode SE. As a result, a non-clasping of the electric hand-held device securely can be differentiated from a clasping of the electric hand-held device.

Figure 2:
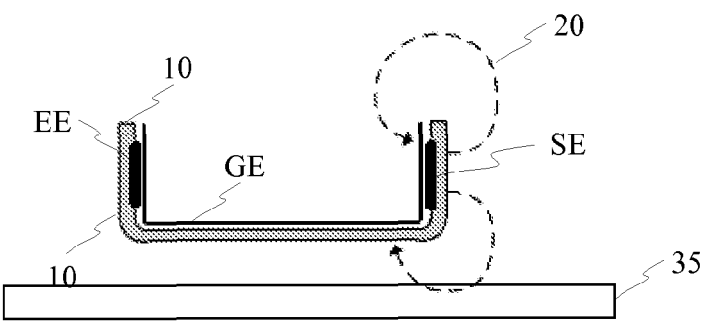
FIG. 2 shows the behavior of lines of electric flux at a hand-held device, which is deposited on an electrically non-conductive shelf space.

FIG. 2 in a cross-sectional view shows an electric hand-held device, which is deposited on an electrically non-conductive surface 35. Arranged in the inside of the housing 10 of the electric hand-held device is an electrically conductive structure GE, which is coupled with the ground potential of the electric hand-held device. The electrically conductive structure GE is provided to reduce the capacitive coupling between the transmitting electrode SE and the receiving electrode EE and to mostly prevent spreading of the lines of electric flux 20 from the transmitting electrode SE all the way to the receiving electrode EE, respectively, as the alternating electric field 20 emitted at the transmitting electrode SE by means of the structure GE already in the closer vicinity of the transmitting electrode SE to a large extent is absorbed by the electrically conductive structure GE, i.e. the alternating electric field 20 emitted at the transmitting electrode SE is coupled into the electrically conductive structure GE. Then almost no current flows into the receiving electrode EE, which is indicative for the fact that the hand-held device is in a deposited state and is not clasped by a hand H, respectively.

Figure 3:
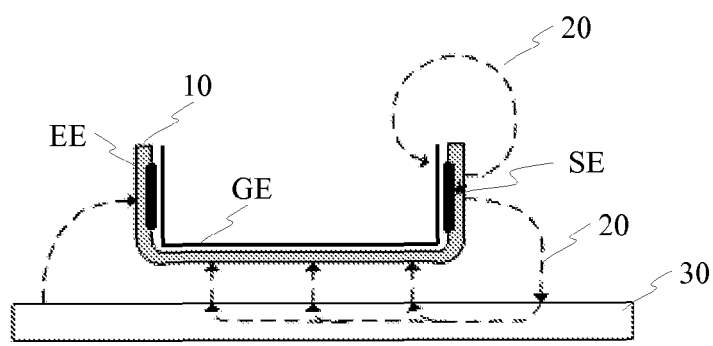
FIG. 3 shows the field behavior at a hand-held device, which is deposited on an electrically conductive shelf space.

Shown in FIG. 3 is an electric hand-held device, which is deposited on a electrically conductive shelf space 30. During depositing of the electric hand-held device on an electrically conductive shelf space there exists the danger that the alternating electric field 20 emitted at the transmitting electrode SE is coupled into the receiving electrode EE via the electrically conductive shelf space and produces a electric current there, which substantially corresponds to the electric current, which is produced in the receiving electrode EE during clasping of the hand-held device by a hand.

In order to mostly avoid a coupling of the alternating electric field at the receiving electrode EE via an electrically conductive shelf space the transmitting electrode SE and the receiving electrode EE according to various embodiments each are arranged at a side wall of the housing 10 of the electric hand-held device. In addition, the electrically conductive structure GE coupled with the ground potential of the electric hand-held device is formed such that a major part of the alternating electric field 20 coupled into the electrically conductive shelf space 30 additionally is coupled into the electrically conductive structure GE. A remaining coupling of the alternating electric field into the receiving electrode EE resulting therefrom is very small, so that on the basis of the remaining rest-coupling into the receiving electrode EE only a very little current is flowing, as is described in more detail with reference to FIG. 4.

The arrangement of the transmitting electrode SE and the receiving electrode EE at the side walls of the electric hand-held device as well as the shaping of the electrically conductive structure GE ensure, that a differentiation of a hand-held device in the deposited state on an electrically conductive shelf space from a clasping by a hand H may be carried out securely.

FIG. 4 shows the temporal behavior of a sensor signal at the receiving electrode EE in different application scenarios. For example, the signal of the sensor may be represented by the current flowing into the receiving electrode EE.

Until a time t1 the electric hand-held device is deposited on an electrically non-conductive shelf space. Because of the very small or non-existing capacitive coupling between the transmitting electrode and the receiving electrode with a hand-held device, which is deposited on an electrically non-conductive shelf space, only a very small receiving current is flowing into the electrode EE.

When the hand-held device now is held in the hand or is clasped by the hand such that the hand at least partially covers the electrodes SE and EE arranged at the housing, because of the now very strong capacitive coupling between the transmitting electrode SE and the receiving electrode EE this results in an escalated increase of the electric current flowing into the receiving electrode EE. The signal curve, which corresponds to the hand-held device in the clasped state, is plotted between the points in time t1 and t2.

When the electric hand-held device now at time t2 is deposited onto an electrically conductive shelf space the capacitive coupling between the transmitting electrode SE and the receiving electrode EE is decreased in an escalated manner. Because of a certain (very small) capacitive coupling between the transmitting electrode SE and the receiving electrode EE via the electrically conductive shelf space the current, which flows into the receiving electrode EE, may be larger with a hand-held device deposited on an electrically conductive shelf space than with a hand-held device deposited on an electrically non-conductive shelf space.

When the sensor signal and the electric current flowing into the receiving electrode, respectively, exceed a predetermined detection threshold 60, a predetermined action may be triggered in the hand-held device. In a similar manner, when falling below the detection threshold 60 a further predetermined action may be triggered in the hand-held device. For example, when exceeding the detection threshold 60, which is the case during a clasping of the hand-held device by a hand, the hand-held device may be transferred from a so-called sleep mode into an active mode. In the active mode the full functionality may be provided.

When the detection threshold 60 is deceeded, the hand-held device again may be transferred from the active mode into the sleep modes, wherein in the sleep mode, for example, al functions of the hand-held device that are not required are deactivated or electric subassemblies not required are not supplied with energy.

In an application of the detection device according to various embodiments a falling below the detection threshold may be used to switch off the display device completely, for example that of a cell phone. The detection device according to various embodiments therefore allows that the electric hand-held device only then is transferred into an active mode when in fact it is clasped by a hand. By means of the arrangement of the sensor electrode and the receiving electrode according to various embodiments as well as the conductive structure GE coupled with the ground potential of the electric hand-held device also erroneous interpretations are avoided reliably, which according to prior art may occur when the electric hand-held device had been deposited on an electrically conductive shelf space.

For a simpler representation a fixed detection threshold 60 is assumed with reference to FIG. 4. De facto, however, a floating detection threshold 60 may be provided, which adapts to the measurement values and to the sensor signal, respectively, within certain limits. Also, several different detection thresholds may be provided, the exceeding and falling below of which, respectively, causes different actions. A second detection threshold not shown here may be provided, which is lower than the detection threshold 60 shown here. Exceeding the lower detection threshold, for example, may result in that an initialization procedure is carried out in the electric hand-held device, so that at exceeding the upper detection threshold 60 the electric hand-held device already is available with full functionality.

Figure 5:
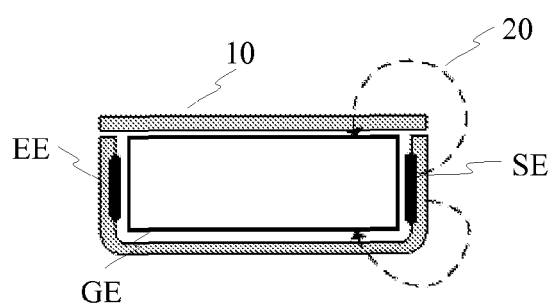
FIG. 5 shows a device according to various embodiments of the detection device in a hand-held device, wherein the electrically conductive structure coupled with ground potential also can be arranged at the upper shell of the housing of a hand-held device.

FIG. 5 shows a cross-sectional view of an electric hand-held device comprising a detection device according to various embodiments. In the embodiment shown in FIG. 5 the electrically conductive structure GE coupled with the ground potential of the electric hand-held device also is arranged in the area of the upper shell of the housing 10 or the upper side of the housing, respectively, so that it is of no meaning for a secure detection of the clasping of a hand or for the depositing of the electric hand-held device on a shelf space, respectively, whether the electric hand-held device is deposited on the shelf space with the lower or upper side. In place of a circumferential electrically conductive structure as shown in FIG. 5 also a second electrically conductive structure GE coupled with the ground potential of the electric hand-held device may be provided for the upper shell of the housing 10.

Depicted in FIGS. 6 to 9 are feasible concepts for generating a signal, by which the transmitting electrode SE is loaded, and for evaluating the signal at the receiving electrode EE.

Figure 6:
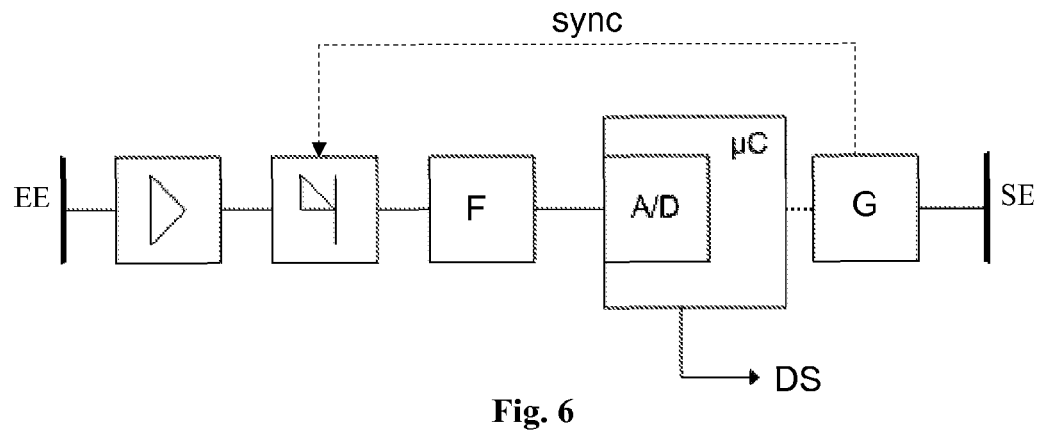
FIG. 6 shows a block diagram of an electric circuitry for signal generation and for analysis.

FIG. 6 shows an evaluation circuitry comprising a peak value rectifier and a synchronous rectifier and a microcontroller. A generator G generates an alternating electric signal, by which the electrode SE is loaded. The generator G may be coupled with the microcontroller. The alternating signal present at the receiving electrode EE, i.e. the alternating electric field coupled into it, may be fed to a rectifier device comprising a downstream filter E. The DC signal, which is rectified and smoothed with the filter, is fed to an analog to digital converter. The analog to digital converter may be part of the microcontroller. The microcontroller is designed to evaluate the digital signal provided by the analog to digital converter in order to detect a clasping of the hand-held device by a hand. The result of the evaluation may be provided as a (digital) detector signal DS by the microcontroller for further processing in the electronic hand-held device. The microcontroller also may be provided for controlling the signal generator G.

Figure 7:
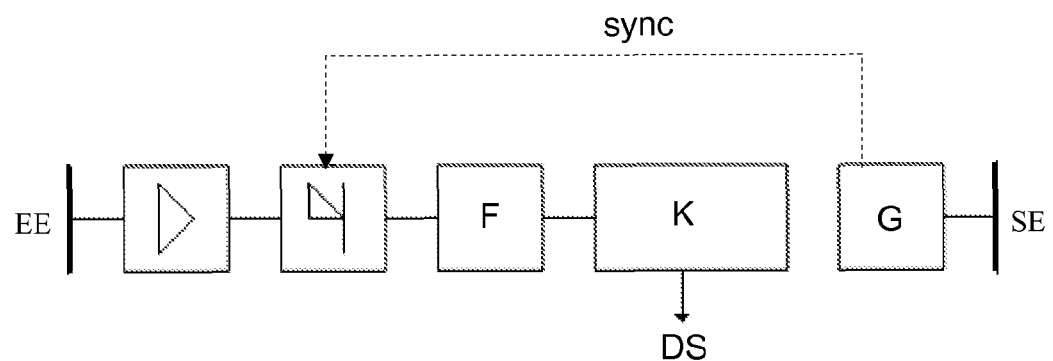
FIG. 7 shows an alternative embodiment of the electric circuitry shown in FIG. 6.

FIG. 7 shows an alternative embodiment of the electric circuitry for signal generation and evaluation shown in FIG. 6. Instead of the microcontroller shown in FIG. 6 and comprising the analog to digital converter a comparator is provided, which just as the microcontroller according to FIG. 6 provides a (digital) detector signal DS for further processing in the electric hand-held device.

Figure 8:
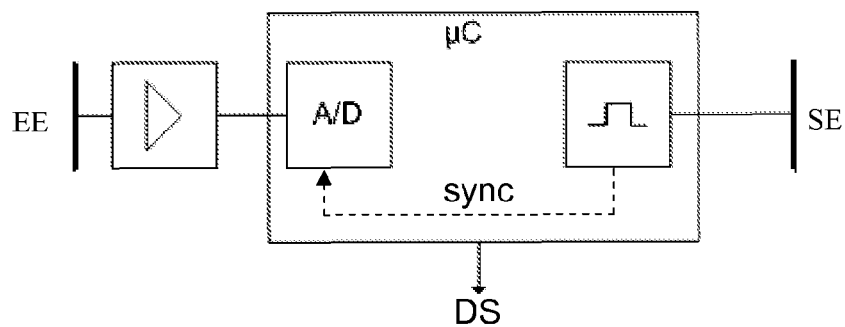
FIG. 8 shows a further embodiment of an electric circuitry for signal generation and for analysis.

FIG. 8 shows a further circuitry for signal generation and evaluation according to various embodiments. Instead of a rectifying of the signal present at the receiving electrode EE an evaluation is carried out here by directly sampling the signal at the receiving electrode. To do so, the alternating signal at the receiving electrode at first is fed to an amplification. The amplified signal is provided to an analog to digital converter, which may be a part of the microcontroller. The microcontroller may comprise a square-wave generator, which provides a signal by means of which the transmitting electrode SE is loaded. In order to improve the electromagnetic tolerance the square-wave signal provided by the microcontroller may be converted to a signal comprising lesser bandwidth, for example to a signal comprising a signal waveform similar to a sine wave.

In the embodiments of a signal production and evaluation shown in FIGS. 6 to 8 the evaluation may be synchronized with the signal generator, which is denoted using "synch" in FIGS. 6 to 8. The synchronization is optional. In the embodiments shown in FIGS. 6 and 7 a synchronous rectification may be carried out instead of a peak-value rectification with the synchronization, which is advantageous with respect to an improved fault tolerance. Shown with reference to FIG. 8 is the principle of the synchronous rectification on a digital basis, wherein the sample-and-hold part of the analog to digital converter is operated synchronously with the signal of the signal generator.

Figure 9:
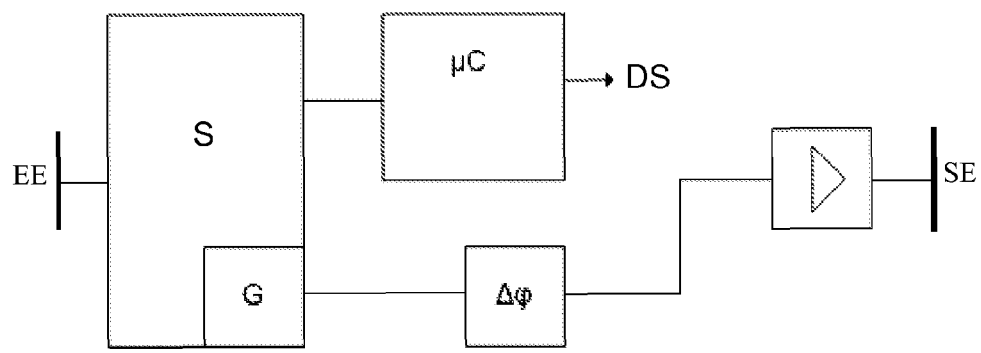
FIG. 9 shows an advantageous embodiment of a circuit device for signal generation and for analysis.
Figure 10:
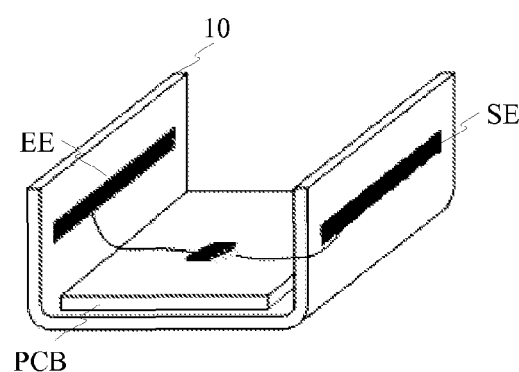
FIG. 10 shows an electrode arrangement at a housing, wherein a PCB serves as ground potential for the electrode arrangement.

FIG. 9 shows a circuit arrangement for a signal generation and an evaluation, which is based on a capacitive sensor S. The capacitive sensor S, whose sensor electrode simultaneously constitutes the receiving electrode EE of the detection device according to various embodiments, operates according to a load method, i.e. the output signal of the capacitive sensor S is dependent on the capacitive load of the sensor electrode or of the receiving electrode EE, respectively. In this case it does not matter whether the capacitive sensor S evaluates an amplitude variation, a frequency variation or a phasing of the sensor signal.

The capacitive sensor S alone, however, cannot determine if the object, which causes a load at the sensor electrode or at the receiving electrode EE, respectively, is a hand which clasps the hand-held device or if the hand-held device is deposited on a shelf space with the side at which the sensor electrode or the receiving electrode EE, respectively, is located. According to various embodiments, at the side wall, which is located opposite to the housing wall at which the receiving electrode EE is arranged, a transmitting electrode SE is provided. The signal provided by the signal generator of the capacitive sensor S is amplified and fed to the transmitting electrode SE. The signal fed to the transmitting electrode SE, if applicable, may be shifted in its phase by providing a phase shifter between the signal generator G and the transmitting electrode SE. Then, an alternating electric field is emitted at the transmitting electrode SE whose phasing is shifted relative to the phasing of the signal provided by the signal generator G.

When a hand clasps the electric hand-held device, according to various embodiments the alternating electric field emitted at the transmitting electrode SE via the hand is passed on to the sensor electrode and the receiving electrode EE, respectively, and injected there. Depending on the phasing of the alternating electric field emitted at the transmitting electrode SE two different effects are caused thereby:

- with a large phasing offset (90° to 270°) a negative feedback is caused so that the capacity measured at the receiving electrode EE strongly rises. A hand clasping the electric hand-held device thereby causes a substantially stronger capacity increase at the receiving electrode EE as without the transmitting electrode SE.
- with a small phasing offset (0° to 90° and 270° to 360°) a positive feedback is caused. A positive feedback shows the effect that during clasping of the electric hand-held device by a hand the capacity at the receiving electrode EE is strongly reduced. Thus, an object, which is located at the sensor electrode or at the receiving electrode EE, respectively, may be distinguished particularly easy from the clasping of the hand-held device by a hand. An object at the sensor electrode or at the receiving electrode EE, respectively, thus results in a rise of capacity, while the clasping of the hand-held device by a hand results in a decrease of capacity.

The capacity sensor S may provide a digital output signal, which may be fed to a microcontroller for evaluation. In turn, the controller may provide a (digital) detector signal DS, which is provided to the electric hand-held device for further processing.

Figure 11:
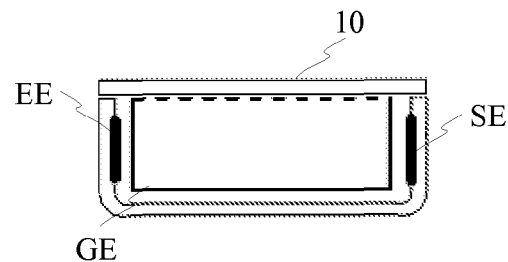
FIG. 11 shows a possible arrangement of a conductive structure coupled with the ground potential of the electric hand-held device for suppressing the propagation of lines of electric flux in the inside of the housing.

The arrangement of the sensor electrode SE and the receiving electrode EE with respect to each other as well as the electrically conductive structure coupled with the ground potential of the electric hand-held device is selected such that a preferably small capacitive coupling between the transmitting and the receiving electrode is reached in a direct manner, therefore not via the hand. First and foremost this is ensured by the electrically conductive structure coupled with the ground potential. In order to reach this in the inside of the housing 10, according to various embodiments an electrically conductive structure coupled with the ground potential of the electric hand-held device is provided in the inside of the housing 10 as shown with reference to FIG. 11. In addition, a second electrically conductive structure coupled with the ground potential of the electric device may be provided at the upper shell of the housing 10.

Figure 12:
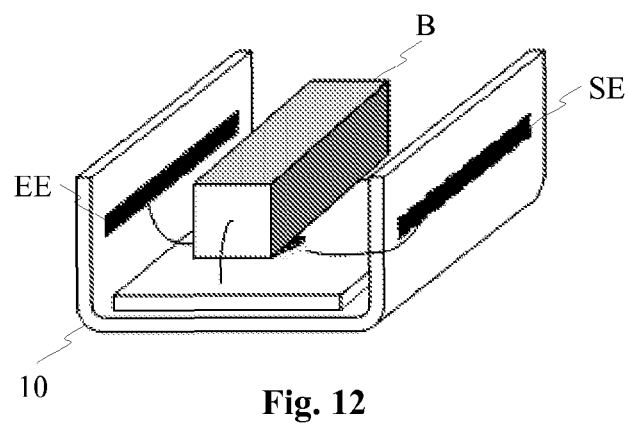
FIG. 12 shows an electrode arrangement according to various embodiments at a housing comprising a current supply arranged in the inside of the housing, which serves as ground potential.

As an alternative to adding an electrically conductive structure, which is coupled with the ground potential, also existing components of the electric hand-held device may be used. An example is shown in FIG. 12 where, for example, a battery B, which is coupled with the ground potential of the electric hand-held device, is used to suppress at least partially a propagation of the lines of electric flux in the inside of the housing 10.

Figure 13:
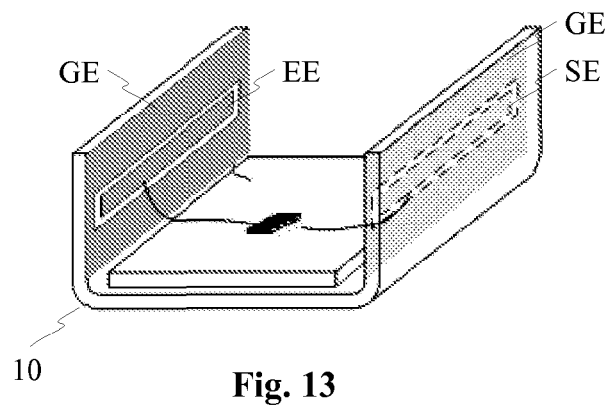
FIG. 13 shows an electrode arrangement according to various embodiments at a housing comprising additional shielding electrodes.
Figure 14:
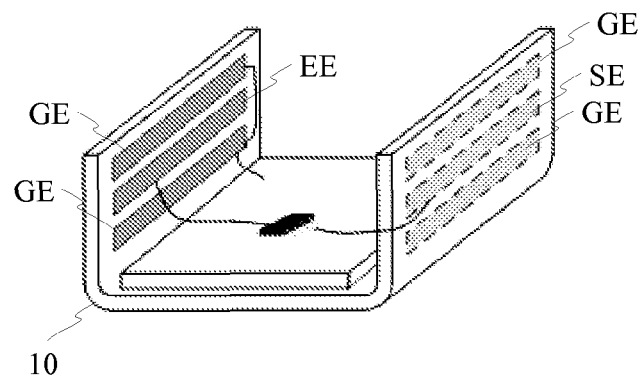
FIG. 14 shows an electrode arrangement according to various embodiments at a housing comprising additional electrodes at the housing, which are coupled with the ground potential of the electric hand-held device.

FIGS. 13 and 14 each show a housing 10 at whose side wall each a transmitting electrode and a receiving electrode is arranged, which each are surrounded by an electrode structure, which is coupled with the ground potential of the hand-held device. Thus, the influence of electrically conductive objects in the vicinity of the hand-held device may be reduced. However, the hand has to be placed on the transmitting and receiving electrode in a more precise manner.

Figure 15:
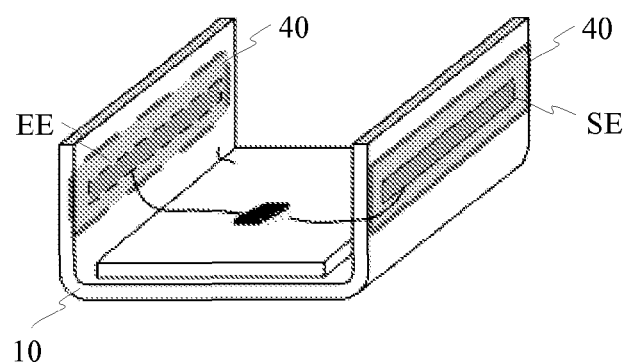
FIG. 15 shows an embodiment of electrodes at a metal housing, which has a coupling with the ground potential of the hand-held device.
Figure 16:
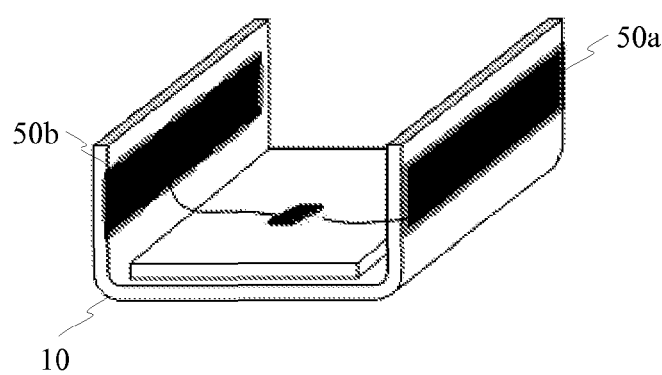
FIG. 16 shows an electrode embodiment at a metal housing, which does not have a coupling with the ground potential of the hand-held device.

FIGS. 15 and 16 show embodiments of electrodes as they may be used for arranging the electrodes SE and EE of an electric hand-held devices comprising a metal housing.

Shown in FIG. 15 is a metal housing 10 of a hand-held device, which is coupled with the ground potential of the electric hand-held device. The electrodes SE and EE here are attached in a manner isolated from the metal housing 10.

Figure 17:
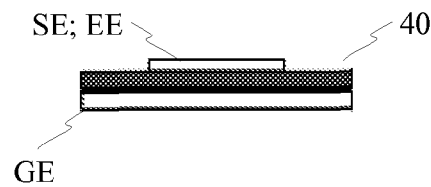
FIG. 17 shows a cross-section of an electrode bundle for a metal housing without coupling with the ground potential of the hand-held device.

FIG. 16 shows a metal housing 10, which is not coupled with the ground potential of the electric hand-held device. Here, in addition, between the electrode SE and EE, respectively, and the metal housing 10 an electrically conductive layer coupled with the ground potential of the electric hand-held device is applied. The electrically conductive layer is arranged in a manner isolated from the electrode and isolated from the metal housing 10, as is depicted in FIG. 17. In doing so, the electrically conductive structure GE preferably is larger than the electrode to mostly prevent a coupling of the alternating electric field of the transmitting electrode SE into the receiving electrode EE via the metal housing 10.

Figure 18:
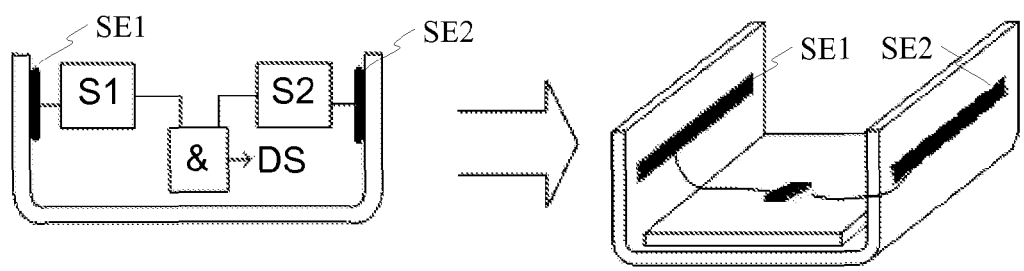
FIG. 18 shows a further embodiment of a detection device for an electric hand-held device for detecting the hand-held device being clasped by a hand.

FIG. 18 shows a solution for detecting a clasping of a hand-held device by a hand, in which two capacitive sensors S1 and S2 are provided. The respective sensor electrodes SE1 and SE2 each are arranged at a side wall of the electric hand-held device. The output signals of the two capacitive sensors S1, S2 are processed by a logic AND link. Thereby it may be evaluated if the capacity of the left electrode SE1 as well as the capacity of the right electrode S2 is greater than normal. When this is the case it may be acted on the assumption that the electric hand-held device is clasped by a hand.

Figure 19:
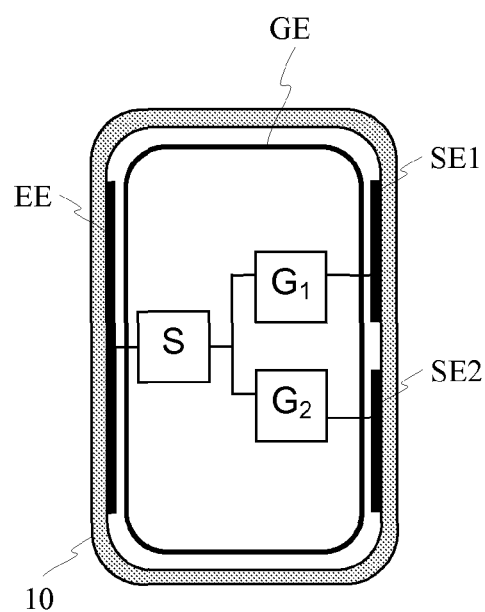
FIG. 19 shows a detection device according to various embodiments comprising a receiving electrode and several transmitting electrodes.

FIG. 19 shows a further embodiment of a detection device according to various embodiments for an electric hand-held device. In the embodiment shown in FIG. 19 two transmitting electrodes SE1 and SE2 separated from each other are arranged at a side wall of the hand-held device. At the side wall of the hand-held device opposite to this side wall a receiving electrode EE is arranged. According to various embodiments, for each transmitting electrode SE1, SE2 a respective signal generator G1 and G2 may be provided, which each provides a signal of different frequency. Thus, the transmitting electrodes S1 and S2 each are loaded with a signal of different frequency.

During clasping of the electric hand-held device by a hand the alternating electric fields emitted at the transmitting electrodes SE1 and SE2, which have different frequencies, are coupled into the shared receiving electrode EE via the hand. The sensor unit or interpretation device, respectively, coupled with the receiving electrode may be designed such that it may separate the different frequency components by means of a frequency analysis and may assign them to the respective transmitting electrodes. In addition to detecting if the hand-held device is clasped by a hand it may also be detected in this manner in which region the hand-held device is clasped by a hand.

Alternatively, instead of a single receiving electrode EE also several receiving electrodes may be provided, wherein preferably in each case one transmitting electrode is assigned to one receiving electrode. It also is feasible to provide several receiving electrodes and only one common transmitting electrode.

In the case of several transmitting electrodes and/or several receiving electrodes different types of clasping of a hand-held device may be detected. In one embodiment, for example, a first transmitting electrode may be arranged at the side wall of the hand-held device and a second transmitting electrode may be arranged at the upside of the hand-held device, so that, for example, when the hand-held device is a cell phone, it also may be distinguished whether the cell phone is clasped by a hand and if the cell phone is held against the ear.

In all of the embodiments shown here the electrodes may be arranged in the inside of the housing. Also, the electrodes may be attached to the outside of the housing, which, however, is disadvantageous with respect to mechanical stress.

The electrodes may be realized as a conductive structure, for example, in the form of a conductive coating layer.

For example, the hand-held device may be a cell phone or a computer mouse, wherein the cell phone or the computer mouse, following the clasping by a hand, may be switched from a sleep mode into an active mode and after removing the hand may be switched from the active mode into the sleep mode.

Figure 20:
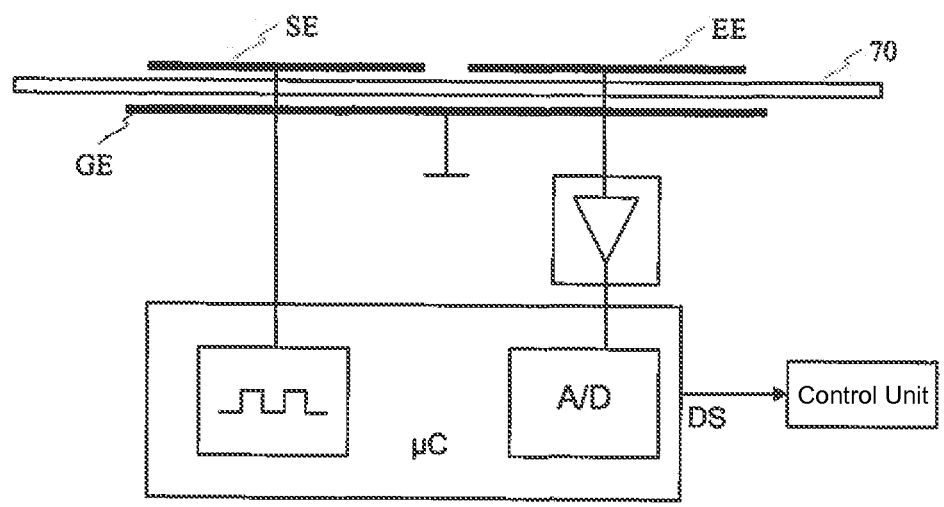
FIG. 20 shows an exemplary arrangement of two electrodes at a housing surface.

As an example, FIG. 20 shows an alternative arrangement of two electrodes at a housing surface. A transmitting electrode SE and a receiving electrode EE are arranged at a housing surface 70, which is composed of an electrically non-conductive material. Arranged below the electrically non-conductive surface 70 is a further electrode GE, which is coupled with the ground potential of the electric hand-held device. The transmitting electrode SE and the receiving electrode EE for example may have a surface area ranging from several $mm^2$ to several $cm^2$. The selection of the definite size of the electrodes SE, EE depends on the space available at the surface of the housing of the electric hand-held device. The sensor electrode SE and the receiving electrode EE may be arranged very close to each other at the electrically non-conductive surface 70. For example, the distance between the transmitting electrode SE and the receiving electrode EE may be one millimeter up to several millimeters.

The transmitting electrode SE and the receiving electrode EE each are coupled with a microcontroller μC. In the embodiment shown here the microcontroller μC is designed such that it provides a square-wave signal by means of which the transmitting electrode SE is loaded. The square-wave signal preferably has a frequency between 10 and 300 kHz. The amplitude of the square-wave signal may amount to several volts. The square-wave signal is voltage driven, which means that a capacitive load at the transmitting electrode SE has no effect on the signal curve. The frequency and/or the duty cycle of the square-wave signal may be varied, which may be carried out by means of the microcontroller μC, for example. Alternatively, a sine-shaped signal may be applied to the transmitting electrode SE.

The receiving electrode EE is coupled with the input of a signal amplifier. The signal amplifier measures the current, which flows into the receiving electrode EE, against the ground potential of the electric hand-held device. The electric value at the output of the signal amplifier is a voltage. The peak-to-peak value of the relevant signal information at the output of the signal amplifier, which forms from the transmitting electrode SE via the receiving electrode EE, behaves proportional to the changes of the signal at the transmitting electrode SE. A transfer impedance amplifier may be provided as the signal amplifier, for example.

The signal present at the output of the signal amplifier is fed to the microcontroller μC, which may measure and evaluate the strength of the relevant signal information. To do so, an analog to digital converter may be provided. By means of the measured or evaluated signal, respectively, the microcontroller μC now may make a decision, which information DS is fed to a control device controlling the hand-held device.

Described with reference to the following FIGS. 21 to 23c is the design of the electrodes SE and EE in order to reach a greatest possible sensitivity with respect to an approaching of a hand towards the electrodes and a greatest possible insensibility with respect to electric and physical disturbances.

Figure 21:
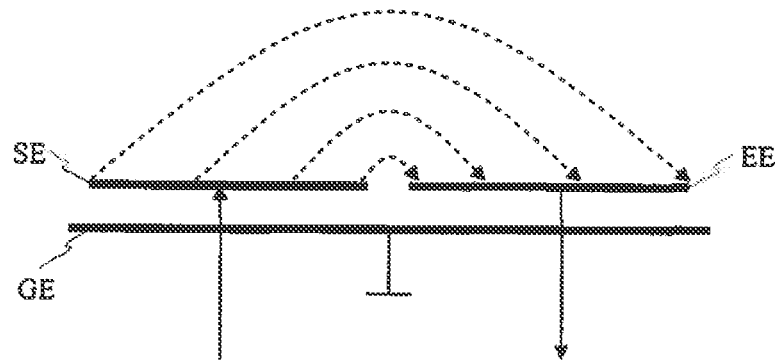
FIG. 21 shows the behavior of the lines of electric flux between two electrodes without an approach by a hand.

FIG. 21 shows a behavior of the lines of electric flux between the transmitting electrode SE and the receiving electrode EE during the absence of a hand approaching the electrodes.

Figure 22:
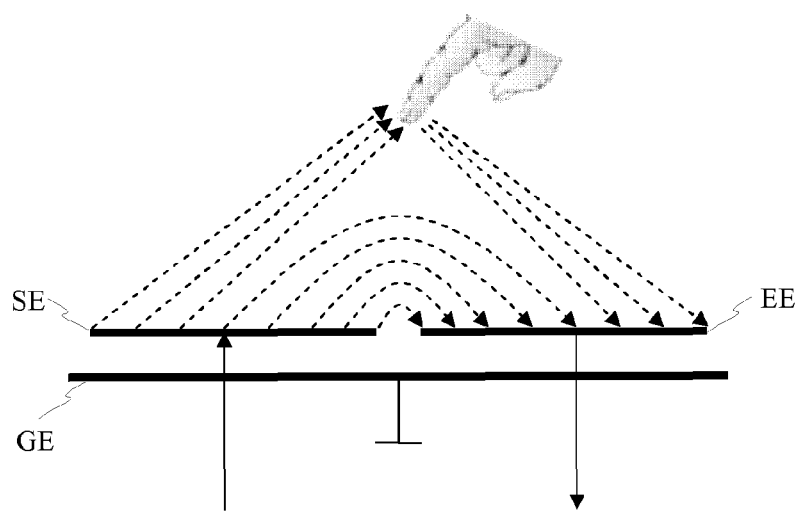
FIG. 22 shows the behavior of the lines of electric flux between two electrodes during an approach by a hand.

FIG. 22 shows the behavior of the lines of electric flux of the transmitting electrode SE towards the receiving electrode EE during the approaching of a finger towards the electrodes. From FIGS. 21 and 22 it can be seen that the number of the lines of electric flux between the transmitting electrode and the receiving electrode EE is greater during the approaching of a finger or of a hand than during an absence of a finger or a hand at the electrodes. From this results that the current flowing into the receiving electrode EE according to FIG. 22 is greater than the current flowing in the receiving electrode EE according to FIG. 21. Also resulting from this is that during a continuous approaching of the finger or the hand towards the electrodes the current, which flows into the receiving electrode, also increases continuously.

The sensor devices shown in FIGS. 20 to 22 have to be designed such that an as low as possible absolute change of the current in the receiving electrode EE may be detected. The limit for the smallest identifiable and detectable variation, respectively, is given by the resolution of the analog to digital converter present in the microcontroller μC.

In order to produce a as large as possible reflection in an absolute value from a small relative current variation in the receiving electrode EE, the current in the receiving electrode EE already has to be at its upper tolerable limit without an approaching by a hand towards the electrodes (see FIG. 21). The electrode design of the transmitting electrode SE and the receiving electrode EE therefore has to be chosen such that a high capacitive basic coupling between the two electrodes already exists without an approaching of a finger or a hand. Inverse field currents should be avoided as far as possible.

The transfer ratio of the voltage at the transmitting electrode SE to the current in the receiving electrode EE may be described with the (complex) conductance (transfer admittance $\underline{Gv}$). The transfer ratio of the current at the input of the signal amplifier, i.e. the current, which flows into the receiving electrode EE, to the voltage at the output of the signal amplifier may be described with a (complex) resistance (transfer impedance $\underline{Rv}$). By means of the combination, i.e. the interlinking of these two transfer ratios $\underline{Gv}$ and $\underline{Rv}$ the output variable at the signal amplifier is of the same type as the input variable by means of which the transmitting electrode SE is loaded, thus here a voltage.

Tests have shown that a particularly good detection of an approach is reached when the product of the absolute value of the transfer admittance and of the absolute value of the transfer impedance ($|\underline{Gv}|*|\underline{Rv}|$) lies between 0.7 and 0.8. This means that the signal amplifier almost is in full conduction. It is advantageous to choose the absolute value of the transfer admittance as large as possible. This may be reached in that the electrode surface areas of the electrodes SE and EE in each case are chosen maximal. In doing so, the absolute value of the transfer admittance may become as small as possible.

When the product of the absolute value of the transfer admittance and of the absolute value of the transfer impedance is not identical for all devices of a commodity, for example based on environmental influences, deviations for example by variation of the frequency of the signal generator, may be corrected.

In order to be able to configure detection threshold values reliably and dynamically in a sensor device according to various embodiments it is advantageous to artificially reduce the resulting field current by means of a reduced excitation, which in an advantageous manner then is carried out when the system with the help of a suitable frequency already is in its ideal operating point and no approaching of a hand is existent. The difference between the original value and the new value may be used as the reference value for the calculation and for the determination, respectively, of all desired detection thresholds since this difference in its absolute value comprises all field characteristics. The reduction of the field current may be carried out by means of a reduction of the voltage at the transmitting electrode SE. Alternatively, also the duty cycle of the square-wave signal may be changed form its symmetry, which may be carried out using the microcontroller µC.

In the embodiment shown in FIG. 20 to FIG. 22 it is particularly advantageous that the surface areas of the transmitting electrode and the receiving electrode are split evenly onto the available surface of the hand-held device, which results in an effective increase of the measurement sensitivity.

Figure 23A:
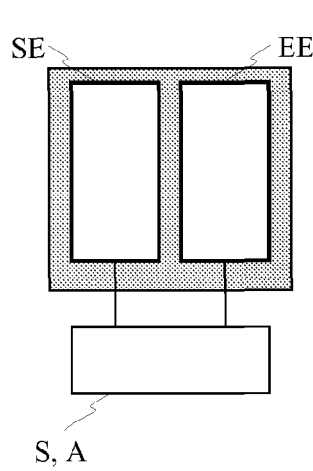
FIG. 23a-23c shows three alternative arrangements of transmitting electrode and receiving electrode at a housing surface.
Figure 23B:
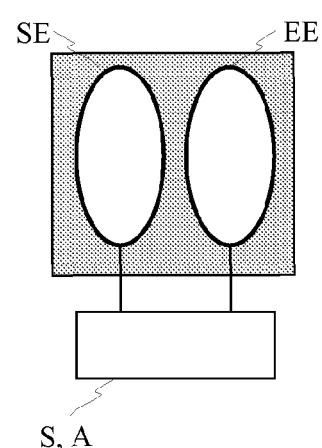
Figure 23C:
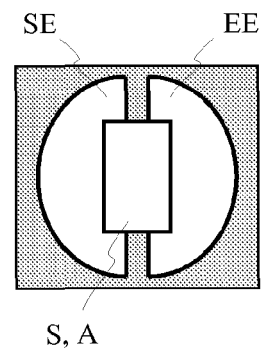

With reference to FIGS. 23a to 23c examples for an arrangement of the transmitting electrode SE and the receiving electrode EE at the surface of a hand-held device are shown.

FIG. 23a shows a first example of two electrodes arranged at a housing surface of an electric hand-held device. The transmitting electrode and the receiving electrode, respectively, are formed rectangular here. The distance between the transmitting electrode SE and the receiving electrode EE preferably is chosen to be very small. The transmitting electrode SE and the receiving electrode EE each are coupled with a sensor electronics S and an interpretation device A, respectively.

FIG. 23b shows a second example of electrodes arranged at a housing surface of an electric hand-held device. Here, the have an oval form, which improves the sensitivity of detection of an approaching.

FIG. 23c shows a further example of an electrode arrangement at a housing surface of an electric hand-held device. The transmitting electrode SE and the receiving electrode EE here each are formed semicircular. The distance between the transmitting electrode SE and the receiving electrode EE preferably is chosen to be small. Embedded between the transmitting electrode SE and the receiving electrode EE is the sensor electronics S and the interpretation device A, respectively. In doing so, in an advantageous manner the complete sensor device, which comprises the transmitting electrode SE, the receiving electrode EE and the sensor electronics S or the interpretation device A, may be arranged at the housing surface of an electric hand-held device. The signal transfer of the sensor electronics S or the interpretation device A to the electronics of the electric hand-held device may be carried out in a galvanic or capacitive manner. The capacitive signal transfer has the advantage that no mechanical coupling points have to be provided at the housing surface.

Figure 24A:
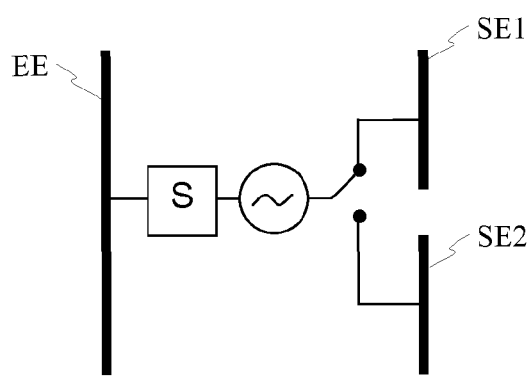
FIG. 24a shows the operation of two transmitting electrodes with a time division multiplex method.
Figure 24B:
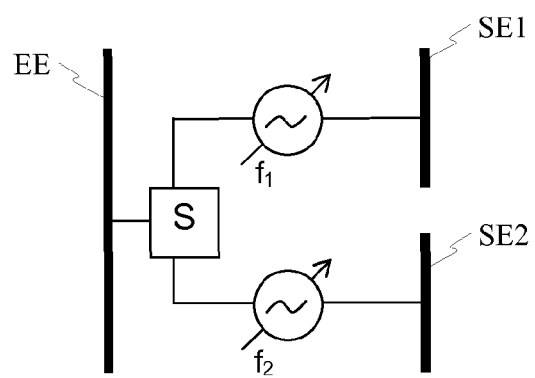
FIG. 24b shows the operation of two transmitting electrodes with a frequency division multiplex method.

FIGS. 24a and 24b show two examples of a device according to various embodiments comprising a receiving electrode and two transmitting electrodes, wherein the transmitting electrodes are operated using a multiplex method.

FIG. 24a shows a sensor device according to various embodiments comprising a receiving electrode and two transmitting electrodes SE1 and SE2. The transmitting electrodes SE1 and SE2 are operated using a time division multiplex method, i.e. the transmitting electrodes SE1 and SE2 temporally one after the other are loaded with an alternating signal, which is provided by a signal generator. The sensor electronics S, which is coupled with the receiving electrode EE, may uniquely assign the current flowing into the receiving electrode EE to a transmitting electrode, since only one transmitting electrode emits an alternating electric field at a time.

FIG. 24b shows a device according to various embodiments comprising a receiving electrode EE and two transmitting electrodes SE1 and SE2. The transmitting electrodes SE1 and SE2 here are operated using a frequency division multiplex method, i.e. the frequency of the alternating signal, by means of which the transmitting electrode SE1 is loaded, is different to the frequency of the alternating signal, by which the transmitting electrode SE2 is loaded. The frequency f1 of the first alternating signal may be 10 kHz for example, the frequency f2 of the second alternating signals may be 50 kHz for example. The sensor electronics S, which is coupled with the receiving electrode EE, is designed such that it may separate the current flowing into the receiving electrode EE into its frequency components in order to be able to assign the respective currents to the respective transmitting electrodes. In a simple embodiment this may be carried out by means of a fast Fourier transform, for example.

The modulation method shown with reference to FIGS. 24a and 24b also my be realized using more than two transmitting electrodes. It is also feasible to provide a transmitting electrode and several receiving electrodes EE, wherein the currents flowing into the respective receiving electrodes EE may be measured and evaluated, respectively, with the help of a suitable multiplex method, for example a time division multiplex method.

Also, it is feasible to operate several electrode elements, each of which consists of at least one receiving electrode and at least one sensor electrode, using a multiplex method.

REFERENCE NUMERALS 10 housing of an electric hand-held device
20 alternating electric field
30 shelf space made of electrically conductive material
35 shelf space made of electrically non-conductive material
40 isolation
50a electrode stack for transmitting electrode
50b electrode stack for receiving electrode
60 detection threshold
70 electrically conductive surface area
A interpretation device
B battery/accumulator
F filter
G signal generator
H hand
K comparator
S capacitive sensor
µC microcontroller
Δϕ phase shifter
A/D analog to digital converter
DS detector signal
EE receiving electrode
SE transmitting electrode
SE1, SE2 sensor electrode
S1, S2 capacitive sensor
GE electrically conductive structure coupled with the ground potential of the electric hand-held device
PCB printed circuit board

What is claimed is:

1. A device for an electric hand-held device for detecting a clasping of the hand-held device by a hand, comprising:
    at least one transmitting electrode configured to emit an alternating electric field, and
    at least one receiving electrode arranged to receive the alternating electric field is at least partially,
    an electrically conductive structure connected with a ground potential of the electric hand-held device;
    wherein the at least one transmitting electrode and the at least one receiving electrode are arranged at the hand-held device such that each is at least partially covered by the hand when the hand-held device is being clasped with the hand,
    wherein when the hand-held device is being clasped with the hand a first portion of the alternating electric field emitted by the transmitting electrode is coupled into the receiving electrode via the hand,
    wherein the first portion of the alternating electric field is a characteristic representative of a clasping of the hand-held device by the hand, and
    wherein the electrically conductive structure is arranged with respect to the at least one transmitting electrode such that when the electric hand-held device is not clasped by the hand, the alternating electric field is prevented from coupling into the at least one receiving electrode.

2. The device of claim 1, wherein between the receiving electrode and the housing and/or between the transmitting electrode and the housing the electrically conductive structure in form of an electrically conductive layer coupled with the ground potential of the electric hand-held device is arranged, wherein a surface area of the electrically conductive layer in each case is larger than the surface area of the receiving electrode and/or of the transmitting electrode.

3. The device of claim 1, wherein
    a second portion of the alternating electric field is coupled into the electrically conductive structure, and
    a third portion of the alternating electric field, which is smaller in absolute value than the second portion, is coupled into the receiving electrode.

4. The device of claim 3, wherein during clasping of the hand-held device the third portion of the alternating electric field is smaller in absolute value than the first portion of the alternating electric field.

5. The device of claim 1, wherein
    the first portion of the alternating electric field generates a first electric current in the receiving electrode,
    the third portion of the alternating electric field generates a second electric current in the receiving electrode, and
    the third portion of the alternating electric field is incorporated into the representative characteristic additionally, wherein the representative characteristic is constituted by an overall current, which results from the first electric current and the second electric current.

6. The device of claim 5, wherein the overall current above a predetermined threshold value is indicative for a clasping of the hand-held device.

7. The device of claim 5, wherein the overall current, which in absolute value is greater than a predetermined threshold value, is indicative for a clasping of the hand-held device.

8. The device of claim 6, wherein
    the transmitting electrode is arranged on a first side wall of a housing of the hand-held device, and
    the receiving electrode is arranged on a second side wall of the housing of the hand-held device,
    wherein the first side wall is arranged opposite to the second side wall.

9. The device of claim 1, wherein
    the receiving electrode is coupled with a capacitive sensor, which comprises a signal generator,
    the output signal of the capacitive sensor depends on the capacitive load of the sensor at the receiving electrode, and
    the transmitting electrode is coupled with the signal generator via a phase shifter to load the transmitting electrode with a signal, which is shifted in its phase with respect to the signal of the signal generator.

10. The device of claim 1, comprising at least two transmitting electrodes, wherein the first transmitting electrode is loaded with a first alternating electric signal and the second transmitting electrode is loaded with a second alternating electric signal, wherein the frequency of the first alternating electric signal is different from the frequency of the second alternating electric signal.

11. The device of claim 10, wherein an interpretation device is formed to separate the frequency components of the alternating electric field coupled into the receiving electrode and to allocate them to the respective transmitting electrode.

12. A method for detecting a clasping of an electric hand-held device by a hand by means of a detection device, which has at least one transmitting electrode, at least one receiving electrode and at least one electrically conductive structure coupled with a ground potential of the electric hand-held device, wherein the at least one transmitting electrode is loaded with an alternating electric voltage so that an alternating electric field is emitted at the at least one transmitting electrode, the method comprising during clasping of the hand-held device with a hand, coupling a first portion of the alternating electric field into the receiving electrode via the hand, detecting a clasping of the hand-held device by evaluating a first electric current in the receiving electrode which is produced by the first portion of the alternating electric field;

during non-clasping of the hand-held device, preventing a coupling of the alternating electric field into the at least one receiving electrode by the at least one electrically conductive structure.

13. The method of claim 12, wherein the at least one electrically conductive structure is arranged relative to the transmitting electrode and to the receiving electrode such that during non-clasping of the hand-held device a coupling of the alternating electric field emitted at the transmitting electrode into the receiving electrode substantially is prevented.

14. The method of claim 13, wherein a sleep mode of the hand-held device is caused when the overall current falls below a predetermined threshold value.

15. The method of claim 13, wherein during non-clasping of the hand-held device a second portion of the alternating electric field is coupled into the electrically conductive structure and a third portion of the alternating electric field, which in absolute value is smaller than the second portion, is coupled into the receiving electrode, during clasping of the hand-held device the third portion of the alternating electric field in absolute value is smaller than the first portion of the alternating electric field, and the third portion of the alternating electric field produces a second electric current in the receiving electrode, wherein the overall current, which results from the first electric current and the second electric current, is indicative for a clasping of the hand-held device.

16. The method of claim 13, wherein at least one of a switching-on mode and an active mode of the hand-held device is caused when the overall current exceeds a predetermined threshold value.

17. An electric hand-held device, comprising:

at least one transmitting electrode, from which an alternating electric field is emitted, and at least one receiving electrode, into which the alternating electric field is coupled at least partially, an electrically conductive structure connected with a ground potential of the electric hand-held device;

wherein the at least one transmitting electrode and the at least one receiving electrode is arranged at the hand-held device such that each is at least partially covered by the hand when the hand-held device is being clasped with the hand, wherein when the hand-held device is being clasped with the hand a first portion of the alternating electric field emitted by the transmitting electrode is coupled into the receiving electrode via the hand, and wherein the first portion of the alternating electric field is a characteristic representative of a clasping of the hand-held device by the hand, and wherein the electrically conductive structure is arranged with respect to the at least one transmitting electrode such that when the electric hand-held device is not clasped by the hand, the alternating electric field is prevented from coupling into the at least one receiving electrode.

18. The electric hand-held device of claim 17, wherein the at least one transmitting electrode and the at least one receiving electrode are arranged at the hand-held device such that they each are at least partially covered by the hand when the hand-held device is being clasped with the hand.

19. The electric hand-held device of claim 17, wherein the electric hand-held device is at least one of a cell phone, an input means for gaming console, a mobile minicomputer, a headphone, a hearing aid device, a computer mouse, and a remote control.

* * * * *